United States Patent
Chang

(10) Patent No.: US 7,002,373 B2
(45) Date of Patent: Feb. 21, 2006

(54) TFT LCD GATE DRIVER CIRCUIT WITH TWO-TRANSISTION OUTPUT LEVEL SHIFTER

(75) Inventor: Kuen-Shan Chang, Hsinchu (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 10/819,960

(22) Filed: Apr. 8, 2004

(65) Prior Publication Data

US 2005/0225354 A1  Oct. 13, 2005

(51) Int. Cl.
*H03K 19/175*  (2006.01)

(52) U.S. Cl. ............................ 326/81; 326/80; 326/68; 326/62; 326/63; 327/333; 345/100

(58) Field of Classification Search ............... 326/62, 326/63, 68, 80–83, 113; 327/333; 345/100, 345/204, 211, 214

See application file for complete search history.

(56) References Cited

U.S. PATENT DOCUMENTS

| 6,359,493 B1 * | 3/2002 | Satomi .................... 327/333 |
| 6,384,643 B1 * | 5/2002 | Grose et al. .............. 327/112 |
| 6,445,226 B1 * | 9/2002 | Taniguchi ................. 327/112 |
| 2002/0135555 A1 | 9/2002 | Yang et al. |

* cited by examiner

*Primary Examiner*—Vibol Tan
(74) *Attorney, Agent, or Firm*—Finnegan, Henderson, Farabow, Garrett & Dunner, L.L.P.

(57) ABSTRACT

A circuit for converting voltage levels for a liquid crystal display panel that comprises a signal including a first state of a first voltage level and a second state of a second voltage level, a first power supply providing the first voltage level, a first high-voltage transistor including a gate electrode coupled to the first power supply, a first electrode receiving the signal, and a second electrode coupled to a node, a second power supply providing a third voltage level, and a second high-voltage transistor including a first electrode coupled to the second power supply and a second electrode coupled to the node, wherein a voltage level at the node is pulled to approximately the third voltage level in response to the first state of the signal, and pulled to approximately the second voltage level in response to the second state of the signal.

26 Claims, 6 Drawing Sheets

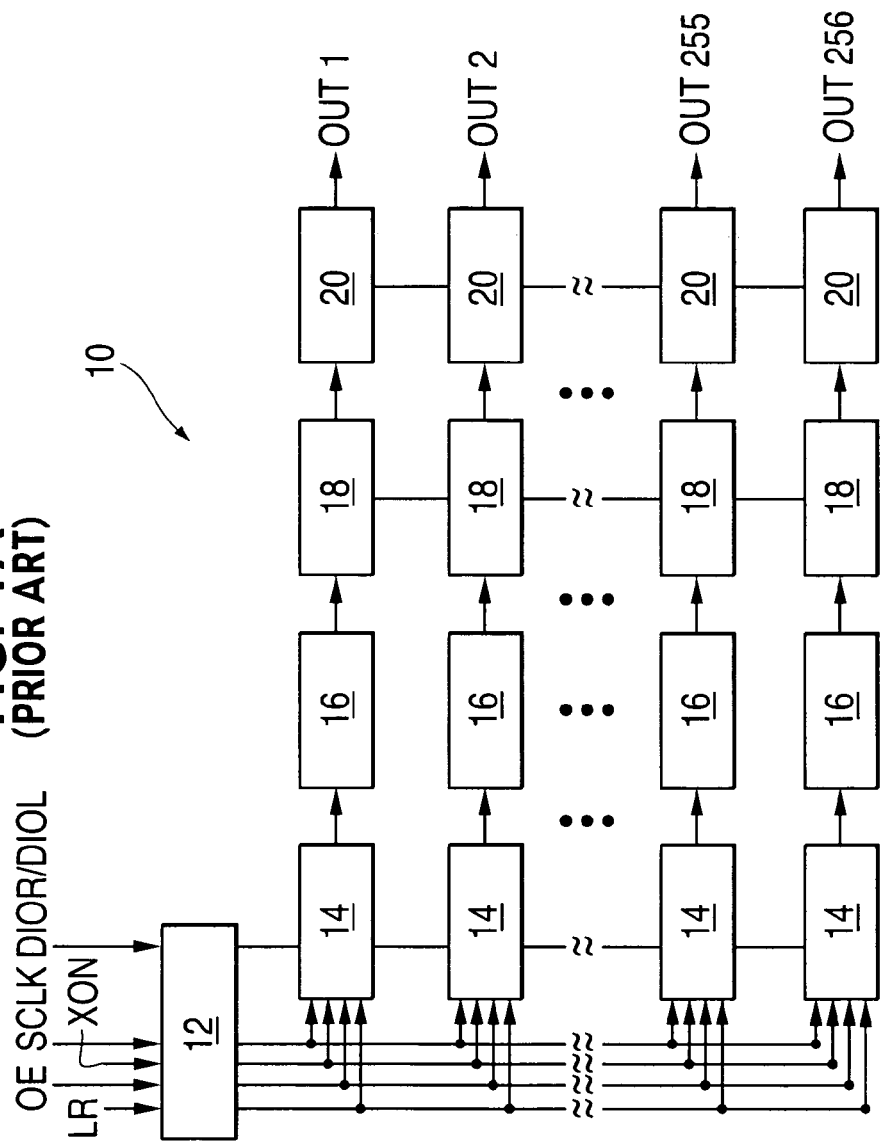

TFT LCD GATE DRIVER CIRCUIT WITH TWO-TRANSISTION OUTPUT LEVEL SHIFTER

FIELD OF THE INVENTION

This invention pertains in general to thin film transistor liquid crystal display ("TFT LCD") devices and more particularly, to an output level shifter of a TFT LCD gate driver.

BACKGROUND OF THE INVENTION

An active matrix liquid crystal display ("LCD") device generally includes a display panel and a drive circuit to drive the display panel. The drive circuit may further include a gate driver for selecting one row of gate lines and a source driver for providing pixel signals through source lines to pixels corresponding to the selected gate lines. A gate driver, generally operating in a mixed-voltage environment, requires circuits for converting different voltage levels used therein.

FIG. 1A is a block diagram of a gate driver 10 in the art. For a XGA/SXGA display system, gate driver 10 may include 256 output channels OUT1 to OUT 256. Gate driver 10 includes an input level shifter 12, shift registers 14, control units 16, output level shifters 18, and output buffers 20. Input level shifter 12 converts voltage levels of input signals from an LCD control application specific integrated circuit ("ASIC"). The input signals include control signals such as a left/right shift control signal LR, an output enable signal OE and a global-on control signal XON, a clock signal SCLK, and data signals such as right data input/output DIOR and left data input/output DIOL. Shift registers 14 shift start pulses of signals DIOR or DIOL according to signal LR at a rising edge of signal SCLK. Control units 16 decode signals from shift registers 14 and control operation modes of gate driver 10 through signals OE and XON. Output level shifters 18 convert voltage levels of signals from control units 16. The level-converted signals are stored in output buffers 20 for driving a display panel.

FIG. 1B is a diagram of the different voltage levels used in gate driver 10. The input signals from an LCD control ASIC have a first voltage level ranging from VSS to VDD, for example, 0 volt (V) and 3.6V, respectively. Input level shifter 12 converts the first voltage level to a second voltage level ranging from $V_{EE}$ to $V_{AA}$, for example, -10V and (-10+(3.6~5)) V, respectively. The second voltage level is used in input level shifter 12, shift registers 14 and control units 16. Output level shifters 18 convert the second voltage level to a third voltage level ranging from $V_{EE}$ to $V_{COM}$, for example, -10V and 25V, respectively. The third voltage level is used in output level shifters 18 and output buffers 20.

An example of output level shifters in the art is disclosed in U.S. patent application Publication No. 20020135555 (hereinafter the '555 application), entitled "Single-Ended High-Voltage Level Shifter for a TFT-LCD Gate Driver". Specifically, in FIG. 5 of the '555 application, a 2-level output level shifter 51 is disclosed. Level shifter 51 includes two high-voltage transistors M1 and M2 for converting voltage levels of an input signal. By incorporating a partial circuitry 511, level shifter 51 reduces chip area. However, partial circuitry 51 includes two other high-voltage transistors M11 and M12 operating in response to global-on control signals XON2 and XON3 to prevent level shifter 51 from large static power consumption. Furthermore, additional level shifters are required to generate voltage levels for the signals XON2 and XON3. As a result, level shifter 51 may disadvantageously become complicated and still occupy a large chip area.

SUMMARY OF THE INVENTION

Accordingly, the present invention is directed to a circuit and a method that obviate one or more of the problems due to limitations and disadvantages of the related art.

To achieve these and other advantages, and in accordance with the purpose of the invention as embodied and broadly described, there is provided a circuit for converting voltage levels for a liquid crystal display panel that comprises a signal including a first state of a first voltage level and a second state of a second voltage level, a first power supply providing the first voltage level, a first high-voltage transistor including a gate electrode coupled to the first power supply, a first electrode receiving the signal, and a second electrode coupled to a node, a second power supply providing a third voltage level, and a second high-voltage transistor including a first electrode coupled to the second power supply and a second electrode coupled to the node, wherein a voltage level at the node is pulled to approximately the third voltage level in response to the first state of the signal, and pulled to approximately the second voltage level in response to the second state of the signal.

Also in accordance with the present invention, there is provided a drive circuit for a liquid crystal display panel that comprises a current source providing a reference voltage, and a plurality of circuits for converting voltage levels for the liquid crystal display panel, each of the circuits further comprising a signal including a first state of a first voltage level and a second state of a second voltage level, a first power supply providing the first voltage level, a first transistor including a gate electrode coupled to the first power supply, a first electrode receiving the signal, and a second electrode coupled to a node, a second power supply providing a third voltage level, and a second transistor including a gate electrode biased at the reference voltage, a first electrode coupled to the second power supply and a second electrode coupled to the node, wherein a voltage level at the node is pulled to approximately the third voltage level in response to the first state of the signal, and pulled to approximately the second voltage level in response to the second state of the signal.

Still in accordance with the present invention, there is provided a circuit for converting voltage levels for a liquid crystal display panel that comprises a first power supply providing a first voltage level, a second power supply providing a second voltage level, a third power supply providing a third voltage level, a first transistor including an electrode coupled to the first power supply, a second transistor including an electrode coupled to the second power supply, a third transistor including an electrode coupled to the third power supply, a first input signal including a first state and a second state, a second input signal including a first state and a second state, an output signal, a first unit turning on and turning off the first transistor respectively in response to the first and second states of the first input signal, a second unit turning on and turning off the second transistor respectively in response to the first and second states of the second input signal, a decoder decoding the first and second input signals and providing a decoded signal including a first state and a second state, and a third unit turning on and turning off the third transistor respectively in response to the first and second states of the decoded signal.

Yet still in accordance with the present invention, there is provided a method of converting voltage levels for a liquid crystal display panel that comprises providing a current source providing a reference voltage, providing a signal including a first state of a first voltage level and a second state of a second voltage level, providing a first power supply providing the first voltage level, providing a first transistor including a gate electrode coupled to the first power supply, a first electrode receiving the signal, and a second electrode coupled to a node, providing a second power supply providing a third voltage level, providing a second transistor including a gate electrode biased at the reference voltage, a first electrode coupled to the second power supply and a second electrode coupled to the node, pulling a voltage level at the node to approximately the third voltage level in response to the first state of the signal, and pulling a voltage level at the node to approximately the second voltage level in response to the second state of the signal.

Further still in accordance with the present invention, there is provided a method of converting voltage levels for a liquid crystal display panel that comprises providing a first power supply to provide a first voltage level, providing a second power supply to provide a second voltage level, providing a third power supply to provide a third voltage level, providing a first transistor including an electrode coupled to the first power supply, providing a second transistor including an electrode coupled to the second power supply, providing a third transistor including an electrode coupled to the third power supply, providing a first input signal including a first state and a second state, providing a second input signal including a first state and a second state, providing an output signal, providing a first unit to turn on and turn off the first transistor respectively in response to the first and second states of the first input signal, providing a second unit to turn on and turn off the second transistor respectively in response to the first and second states of the second input signal, providing a decoder to decode the first and second input signals and provide a decoded signal including a first state and a second state, and providing a third unit to turn on and turn off the third transistor respectively in response to the first and second states of the decoded signal.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate one embodiment of the invention and together with the description, serve to explain the principles of the invention.

BRIEF DESCRIPTION OF THE DRAWINGS

FIG. 1A is a block diagram of a gate driver in the art;

DESCRIPTION OF THE EMBODIMENTS

Reference will now be made in detail to the present embodiment of the invention, an example of which is illustrated in the accompanying drawings. Wherever possible, the same reference numbers will be used throughout the drawings to refer to the same or like parts.

Figure 1B:
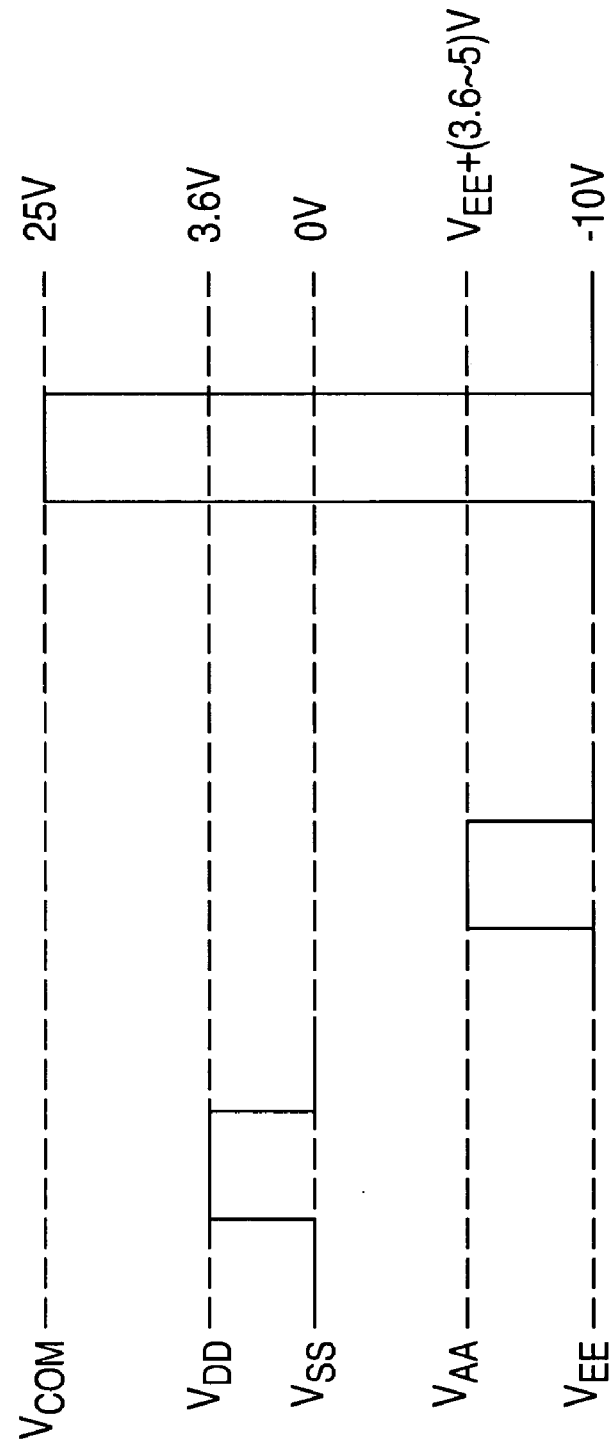
FIG. 1B is a diagram of different voltage levels used in a gate driver in the art.
Figure 2:
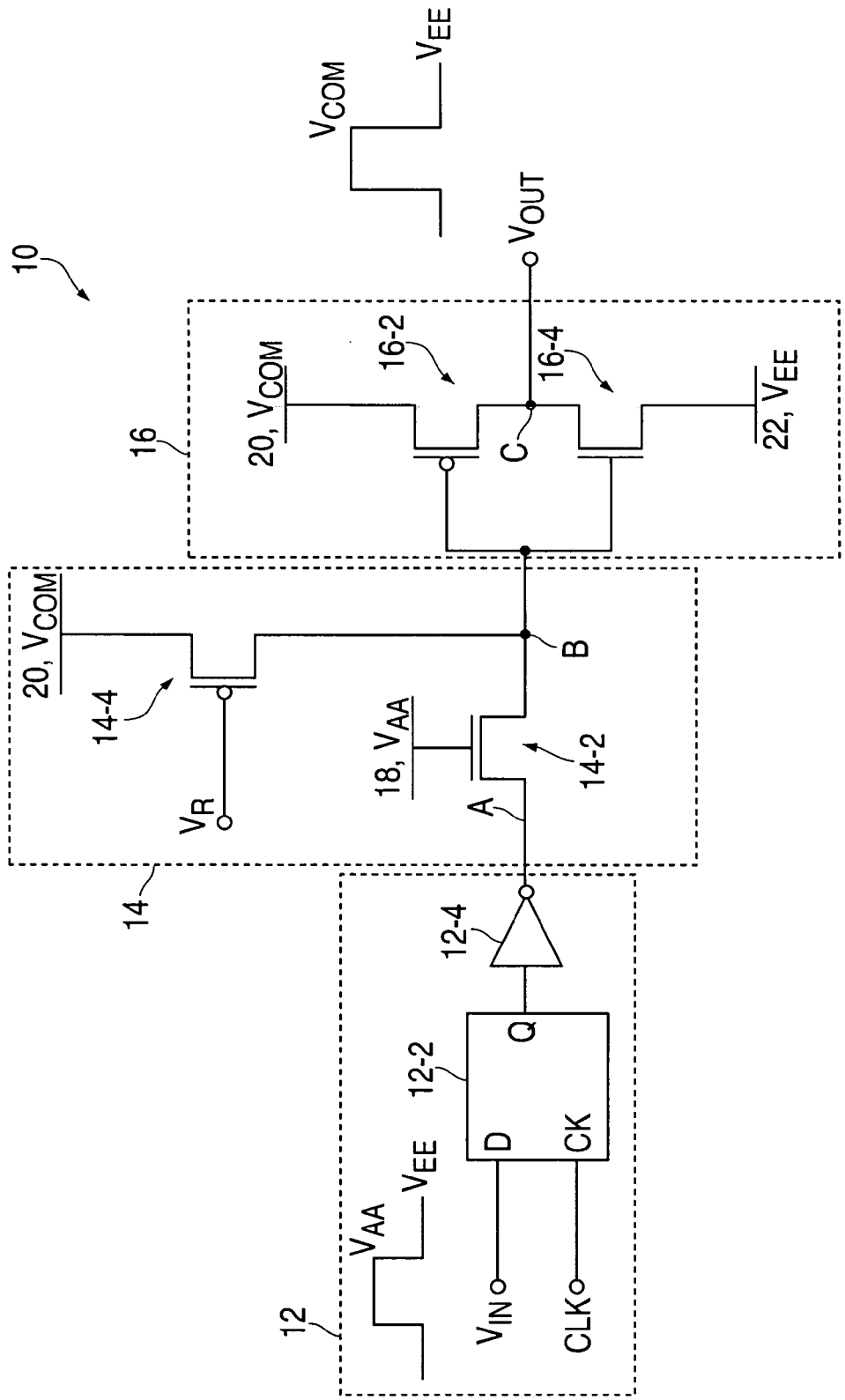
FIG. 2 is a circuit diagram of a circuit for converting voltage levels in accordance with one embodiment of the present invention.

FIG. 2 is a circuit diagram of a circuit 10 for converting voltage levels in accordance with one embodiment of the present invention. Circuit 10 provides a 2-level output signal $V_{OUT}$ in response to a 2-level input signal $V_{IN}$ for one of, for example, 256 output channels of a gate driver (not shown). Circuit 10 includes a shift register 12, a level shifter 14, and an output buffer 16. Shift register 12 further comprises a latch device 12-2, for example, a D-type flip-flop, and an inverter 12-4. Input signal $V_{IN}$ includes a first state of a first voltage level, for example, $V_{AA}$, and a second state of a second voltage level, for example, $V_{EE}$. Inverter 12-4 provides at its output terminal, or a node A, an inverse of input signal $V_{IN}$.

Level shifter 14 further comprises a first transistor 14-2 and a second transistor 14-4. First transistor 14-2 includes a gate electrode (not numbered) coupled to a first power supply 18 providing the first voltage level $V_{AA}$, a first electrode (not numbered) coupled to node A, and a second electrode (not numbered) coupled to a node B. Second transistor 14-4 includes a gate electrode (not numbered) coupled to a reference voltage $V_R$, a first electrode (not numbered) coupled to a second power supply 20 providing a third voltage level, for example, $V_{COM}$, and a second electrode (not numbered) coupled to node B. Reference voltage $V_R$, generated by a current source, is globally provided to each of the 256 output channels of a gate driver. The voltage level of reference voltage $V_R$ is predetermined to ensure that second transistor 14-4 is turned on.

In one embodiment according to the invention, first transistor 14-2 is a high-voltage n-channel metal-oxide-semiconductor (NMOS) transistor, and second transistor 14-4 is a high-voltage p-channel metal-oxide-semiconductor (PMOS) transistor. Since first and second transistors 14-2 and 14-4 serve as a switch and a pull-up device, respectively, they may be designed with advantageously smaller sizes.

Output buffer 16 further comprises a PMOS transistor 16-2 and an NMOS transistor 16-4 which together form a complementary inverter. PMOS transistor 16-2 includes a gate electrode (not numbered) coupled to node B, a first electrode (not numbered) coupled to second power supply 20, and a second electrode (not numbered) coupled to a node C which serves as an output terminal of circuit 10. NMOS transistor 16-4 includes a gate electrode (not numbered) coupled to node B, a first electrode (not numbered) coupled to node C, and a second electrode (not numbered) coupled to a third power supply 22 providing the second voltage level $V_{EE}$.

In response to the first state of input signal $V_{IN}$, or the second state of an inverse signal present at node A, first transistor 14-2 is turned on. A voltage level at node B is pulled to approximately the second voltage level $V_{EE}$, which in turn turns on PMOS transistor 16-2 and turns off NMOS transistor 16-4. A voltage level or $V_{OUT}$ at node C is approximately the third voltage level $V_{COM}$.

In response to the second state of input signal $V_{IN}$, or the first state of the inverse signal present at node A, first transistor 14-2 is turned off. A voltage level at node B is pulled to approximately the third voltage level $V_{COM}$, which in turn turns off PMOS transistor 16-2 and turns on NMOS transistor 16-4. A voltage level $V_{OUT}$ at node C is approximately the second voltage level $V_{EE}$. As a result, input voltage levels $V_{AA}$ and $V_{EE}$ are converted to output voltage levels $V_{COM}$ and $V_{EE}$, respectively.

Figure 3:
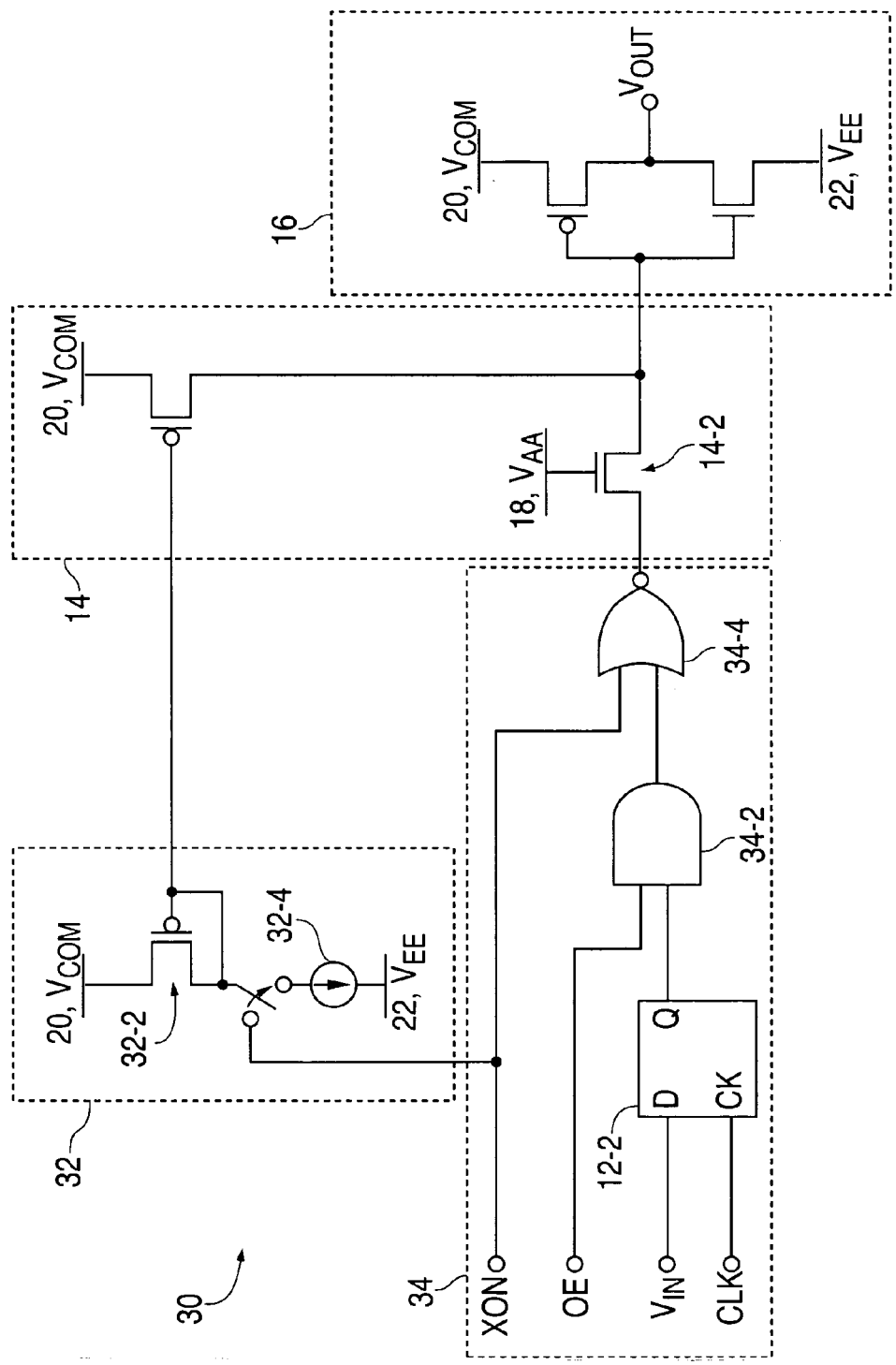
FIG. 3 is a circuit diagram of a circuit for converting voltage levels in accordance with another embodiment of the present invention.

FIG. 3 is a circuit diagram of a circuit 30 for converting voltage levels in accordance with another embodiment of the present invention. Circuit 30 includes a voltage generator 32, a shift register and control unit 34, a level shifter 14, and an output buffer 16. Voltage generator 32, providing reference voltage $V_R$ to all of the output channels of a gate driver, includes a high-voltage transistor 32-2 and a current source 32-4. Transistor 32-2 includes a gate electrode (not numbered) coupled to the gate electrode of second transistor 14-4 of level shifter 14, a first electrode (not numbered) coupled to second power supply VCOM, and a second electrode (not numbered) coupled to current source 32-4. Shift register and control unit 34 includes a latch device 12-2, an AND gate 34-2, and a NOR gate 34-4. Circuit 30 provides a 2-level output signal $V_{OUT}$ in response to a 2-level input signal $V_{IN}$ for one of, for example, 256 output channels of a gate driver.

The gate driver may operate in one of three modes, i.e., a normal mode, an OFF mode, and an ON mode. First and second control signals XON and OE, both including a first state of the first voltage level $V_{AA}$ and a second state of the second voltage level $V_{EE}$, are provided in selecting one of the three modes. The gate driver operates at the normal mode when first control signal XON of the second state $V_{EE}$ and second control signal OE of the first state $V_{AA}$ are provided. In the normal mode, in response to the first state $V_{AA}$ of input signal $V_{IN}$, the output voltage level $V_{OUT}$ is pulled to approximately the third voltage level $V_{COM}$. In response to the second state $V_{EE}$ of input signal $V_{IN}$, the output voltage level $V_{OUT}$ is pulled to approximately the second voltage level $V_{EE}$.

The gate driver operates at the OFF mode when first control signal XON of the second state $V_{EE}$ and second control signal OE of the second state $V_{EE}$ are provided. In the OFF mode, an output of AND gate 34-2 is logic zero or $V_{EE}$, regardless of the state of input signal $V_{IN}$. NOR gate 34-4, in response to the $V_{EE}$-level control signals XON and OE present at its input terminals, provides a logic one value or $V_{AA}$ at its output terminal. The output voltage level $V_{OUT}$ is subsequently pulled to approximately the second voltage level $V_{EE}$.

The gate driver operates at the ON mode when first control signal XON of the first state $V_{AA}$ is provided, regardless of the states of second control signal OE and input signal $V_{IN}$. In the ON mode, an output of NOR gate 34-4 is logic zero or $V_{EE}$. The output voltage level $V_{OUT}$ is subsequently pulled to approximately the third voltage level $V_{COM}$. As a global signal, first control signal XON, when the first state $V_{AA}$ is asserted, will turn on all of the output channels of the gate driver, disadvantageously resulting in a large static current flowing in the gate driver. To prevent the gate driver from an undesirable static current, in the particular embodiment shown in FIG. 3, current source 32-4 is cut off in response to the first state of first control signal XON.

Figure 4:
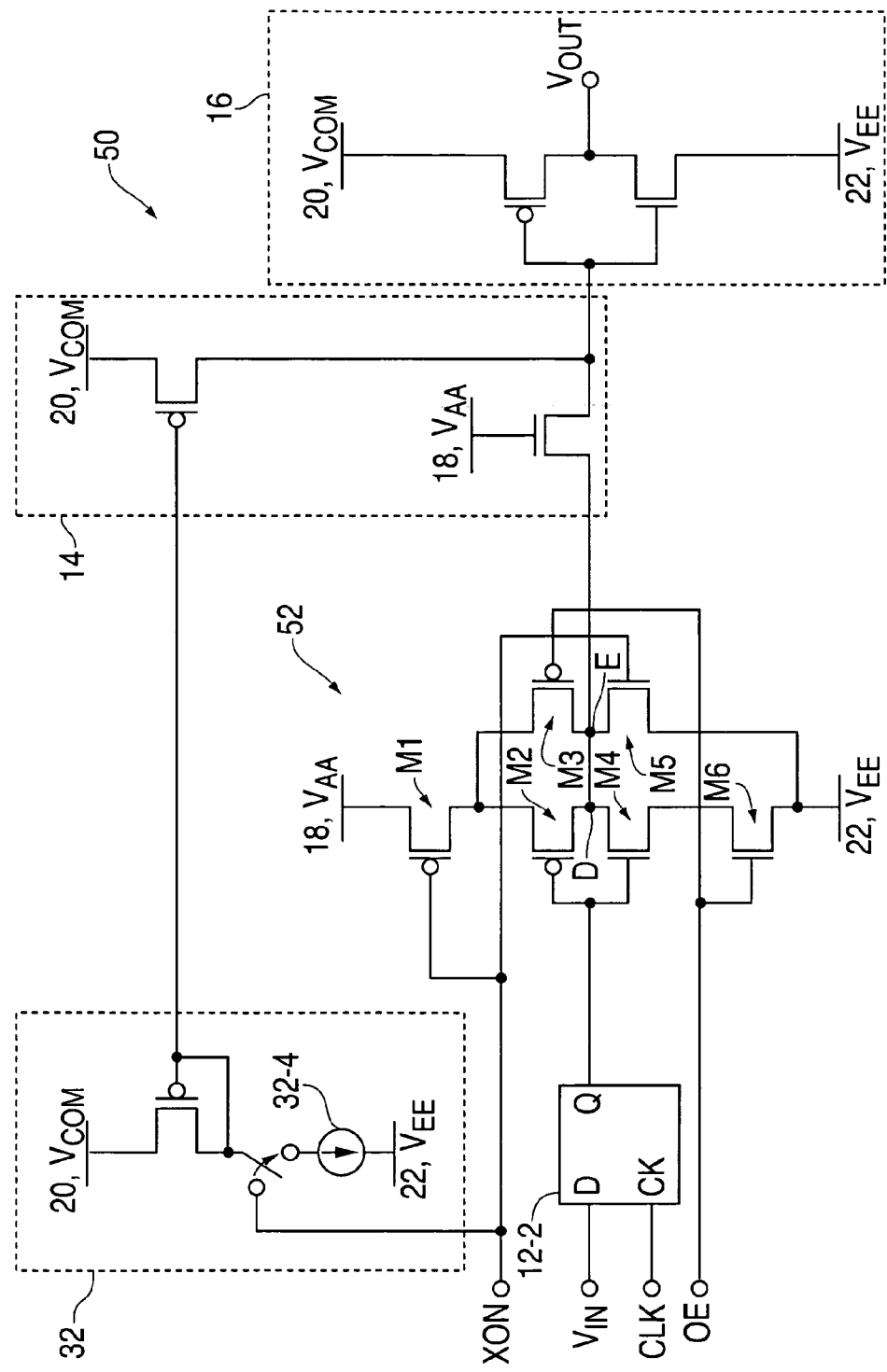
FIG. 4 is a circuit diagram of a circuit for converting voltage levels in accordance with still another embodiment of the present invention.

FIG. 4 is a circuit diagram of a circuit 50 for converting voltage levels in accordance with still another embodiment of the present invention. Circuit 50 includes a voltage generator 32, a shift register and control unit 52, a level shifter 14, and an output buffer 16. Shift register and control unit 52 further comprises a latch device 12-2 and low-voltage transistors M1 to M6. Circuit 50 provides a 2-level output signal $V_{OUT}$ in response to a 2-level input signal $V_{IN}$ for one of, for example, 256 output channels of a gate driver. The gate driver operates at a normal mode when first control signal XON of the second state $V_{EE}$ and second control signal OE of the first state $V_{AA}$ are provided. In the normal mode, transistors M1 and M6 are turned on and transistors M3 and M5 are turned off. In response to the first state $V_{AA}$ of input signal $V_{IN}$, transistor M4 is turned on and transistor M2 is turned off. An output voltage level at a node D is pulled to approximately the second voltage level $V_{EE}$, and the output voltage level $V_{OUT}$ is pulled to approximately the third voltage level $V_{COM}$. In response to the second state $V_{EE}$ of input signal $V_{IN}$, transistor M4 is turned off and transistor M2 is turned on. An output voltage level at node D is pulled to approximately the first voltage level $V_{AA}$, and the output voltage level $V_{OUT}$ is pulled to approximately the second voltage level $V_{EE}$.

The gate driver operates at an OFF mode when first control signal XON of the second state $V_{EE}$ and second control signal OE of the second state $V_{EE}$ are provided. In the OFF mode, transistors M1 and M3 are turned on, and transistors M5 and M6 are turned off. Regardless of the state of input signal $V_{IN}$, a voltage level at a node E is pulled to approximately the first voltage level $V_{AA}$, and the output voltage level $V_{OUT}$ is pulled to approximately the second voltage level $V_{EE}$.

The gate driver operates at an ON mode when first control signal XON of the first state $V_{AA}$ is provided, regardless of the states of second control signal OE and input signal $V_{IN}$. In the ON mode, transistor M1 is turned off and transistor M5 is turned on. A voltage level at node E is pulled to approximately the second voltage level $V_{EE}$, and the output voltage level $V_{OUT}$ is pulled to approximately the third voltage level $V_{COM}$. To prevent the gate driver from a large static current, current source 32-4 is cut off in response to the first state of first control signal XON.

Figure 5:
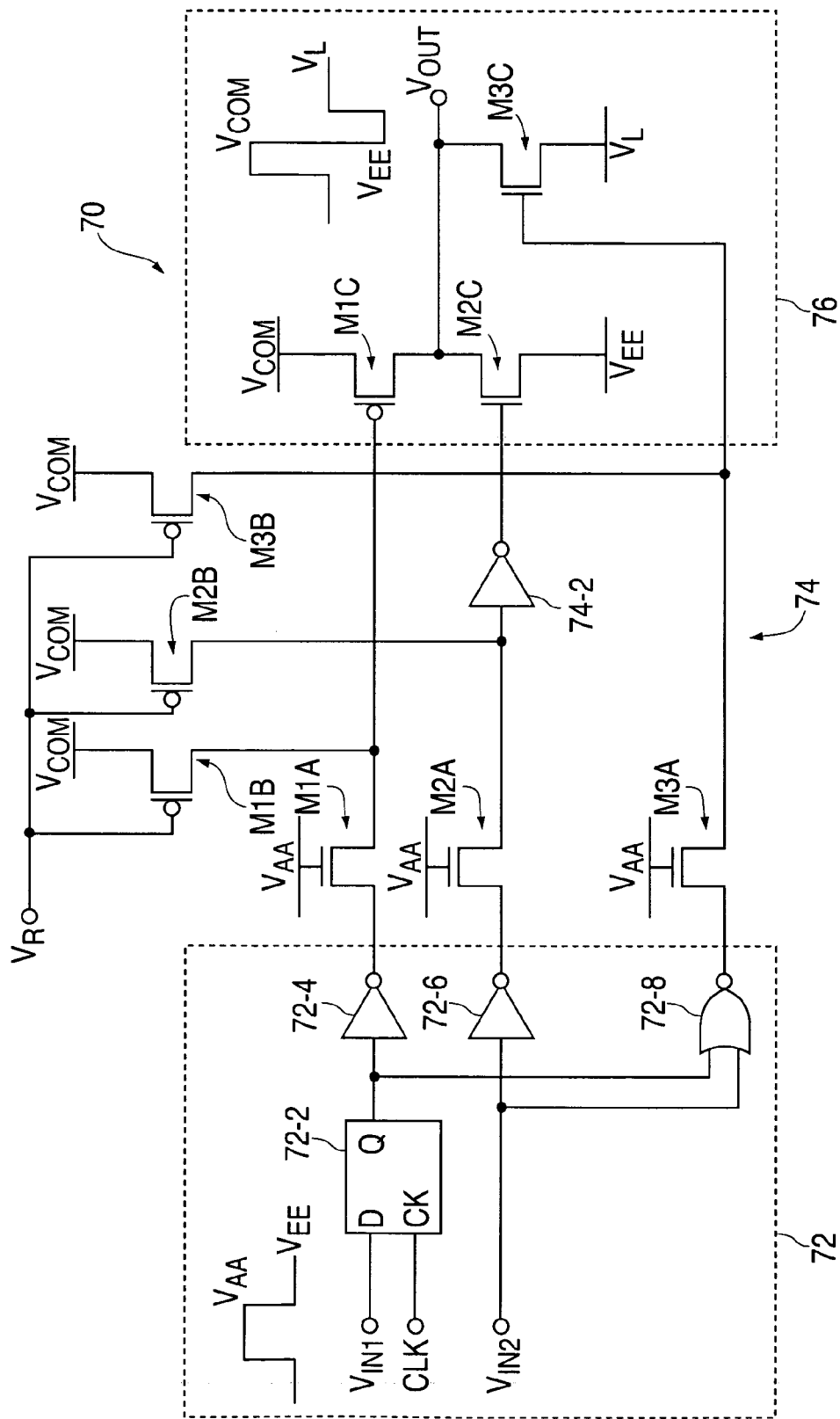
FIG. 5 is a circuit diagram of a circuit for converting voltage levels in accordance with yet another embodiment of the present invention.

FIG. 5 is a circuit diagram of a circuit 70 for converting voltage levels in accordance with yet another embodiment of the present invention. Circuit 70 provides a 3-level output signal $V_{OUT}$ in response to 2-level input signals $V_{IN1}$, and $V_{IN2}$ for one of, for example, 256 output channels of a gate driver. Both input signals $V_{IN1}$ and $V_{IN2}$ include a first state of a first voltage level, for example, $V_{AA}$, and a second state of a second voltage level, $V_{EE}$. Circuit 70 includes a shift register and decoder 72, a level shifter 74, and an output buffer 76. Shift register and decoder 72 further includes a latch device 72-2, a first inverter 72-4, a second inverter 72-6, and a decoder 72-8. In the particular embodiment, decoder 72-8 includes a NOR gate.

Level Shifter 74 further includes a first, second and third sets of shifter units (not numbered). The first set of shifter unit includes transistors M1A and M1B which function to serve as a switch and a pull-up device, respectively. Likewise, the second set of shifter unit includes transistors M2A and M2B, and the third set of shifter unit includes transistors M3A and M3B. Second set of shifter unit further includes an inverter 74-2 to prevent a static current flowing in transistor M2B. In the particular embodiment, inverter 74-2 includes a NOT gate. Each of transistors M1A, M2A and M3A includes a gate electrode (not numbered) coupled to a first power supply providing the first voltage level $V_{AA}$, and an electrode (not numbered) coupled to one of first inverter 72-4, second inverter 72-6 or decoder 72-8. Each of transistors M1B, M2B and M3B includes a gate electrode (not numbered) coupled to a reference voltage $V_R$ provided by a current source (not shown).

Output buffer 76 further includes a first, second and third transistors M1C, M2C and M3C corresponding to the first, second and third sets of shifter units, respectively. First transistor M1C includes an electrode (not numbered) coupled to a second power supply providing a third voltage level $V_{COM}$. Second transistor M2C includes an electrode (not numbered) coupled to a third power supply providing the second voltage level $V_{EE}$. Third transistor M3C includes an electrode (not numbered) coupled to a fourth power supply providing a fourth voltage level $V_L$. Fourth voltage $V_L$ functions to serve as an off-control voltage for an LCD device. In one embodiment according to the invention, $V_L$ ranges from approximately $V_{EE}$ to ($V_{EE}$+10V).

In response to $V_{IN1}$ of $V_{AA}$ level and $V_{IN2}$ of $V_{EE}$ level, transistor M1C is turned on and transistors M2C and M3C are turned off. Output voltage $V_{OUT}$ is pulled to approximately $V_{COM}$. In response to $V_{IN1}$ of $V_{EE}$ level and $V_{IN2}$ of $V_{AA}$ level, transistor M2C is turned on and transistors M1C and M3C are turned off. Output voltage $V_{OUT}$ is pulled to approximately $V_{EE}$. In response to $V_{IN1}$ of $V_{EE}$ level and $V_{IN2}$ of $V_{EE}$ level, transistor M3C is turned on and transistors M1C and M2C are turned off. Output voltage $V_{OUT}$ is pulled to approximately $V_L$. In response to $V_{IN1}$ of $V_{AA}$ level and $V_{IN2}$ of $V_{AA}$ level, transistors M1C and M2C are turned on and transistor M3C is turned off. Output voltage $V_{OUT}$ is pulled to approximately $V_L$.

The present invention also provides a method of converting voltage levels for a liquid crystal display panel. A current source 32-4 is provided to provide a reference voltage $V_R$. A signal including a first state of a first voltage level $V_{AA}$ and a second state of a second voltage level $V_{EE}$ is provided. A first power supply 18 providing the first voltage level $V_{AA}$ is provided. A first transistor 14-2 including a gate electrode coupled to first power supply 18, a first electrode receiving the signal, and a second electrode coupled to a node B is provided. A second power supply 20 providing a third voltage level $V_{COM}$ is provided. A second transistor 14-4 including a gate electrode biased at the reference voltage $V_R$, a first electrode coupled to second power supply 20 and a second electrode coupled to node B is provided. A voltage level at node B is pulled to approximately the third voltage level $V_{COM}$ in response to the first state of the signal. A voltage level at node B is pulled to approximately the second voltage level $V_{EE}$ in response to the second state of the signal.

In one embodiment according to the invention, a first control signal XON including a first state of a first voltage level $V_{AA}$ and a second state of a second voltage level $V_{EE}$ is provided. A second control signal OE including a first state of the first voltage level $V_{AA}$ and a second state of the second voltage level $V_{EE}$ is provided. Current source 32-4 is turned off in response to the first state $V_{AA}$ of first control signal XON.

The present invention also provides a method of converting voltage levels for a liquid crystal display panel. A first power supply $V_{COM}$, a second power supply $V_{EE}$, and a third power supply $V_L$ are provided. A first transistor M1C including an electrode coupled to the first power supply $V_{COM}$ is provided. A second transistor M2C including an electrode coupled to the second power supply $V_{EE}$ is provided. A third transistor M3C including an electrode coupled to the third power supply $V_L$ is provided. A first input signal $V_{IN1}$ including a first state and a second state is provided. A second input signal $V_{IN2}$ including a first state and a second state is provided. An output signal $V_{OUT}$ is provided. A first unit is provided to turn on and turn off first transistor M1C respectively in response to the first and second states of first input signal $V_{IN1}$. A second unit is provided to turn on and turn off second transistor M2C respectively in response to the first and second states of second input signal $V_{IN2}$. A decoder 72-8 is provided to decode first and second input signals $V_{IN1}$ and $V_{IN2}$ and provide a decoded signal including a first state and a second state. A third unit is provided to turn on and turn off third transistor M3C respectively in response to the first and second states of the decoded signal.

In one embodiment according to the invention, each of the first, second, and third units is provided with a first transistor 14-2 including a gate electrode coupled to a fourth power supply providing a fourth voltage level $V_{AA}$, and a second transistor 14-4 including an electrode coupled to the first power supply $V_{COM}$.

A voltage level of output signal $V_{OUT}$ is pulled to approximately the first voltage level $V_{COM}$ in response to the first state of first input signal $V_{IN1}$ and the second state of second input signal $V_{IN2}$. A voltage level of output signal $V_{OUT}$ is pulled to approximately the second voltage level $V_{EE}$ in response to the second state of first input signal $V_{IN1}$ and the second state of second input signal $V_{IN2}$. A voltage level of output signal $V_{OUT}$ is pulled to approximately the third voltage level $V_L$ in response to first and second input signals $V_{IN1}$ and $V_{IN2}$ being at a same state.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A circuit for converting voltage levels for a liquid crystal display panel comprising:
   a current source to provide a reference voltage;
   a signal including a first state of a first voltage level and a second state of a second voltage level;
   a first power supply providing the first voltage level;
   a first high-voltage transistor including a gate electrode coupled to the first power supply, a first electrode receiving the signal, and a second electrode coupled to a node;
   a second power supply providing a third voltage level; and
   a second high-voltage transistor including a gate electrode biased at the reference voltage, a first electrode coupled to the second power supply and a second electrode coupled to the node;
   wherein a voltage level at the node is pulled to approximately the third voltage level in response to the first state of the signal, and pulled to approximately the second voltage level in response to the second state of the signal.

2. The circuit of claim 1 further comprising a complementary inverter coupled between the second power supply and a third power supply providing the second voltage level.

3. The circuit of claim 2, the complementary inverter further comprising:

a first transistor including a gate electrode coupled to the node, and an electrode coupled to the second power supply; and a second transistor including a gate electrode coupled to the node, and an electrode coupled to the third power supply.

4. The circuit of claim 1 further comprising a control signal including a first state of the first voltage level and a second state of the second voltage level.

5. The circuit of claim 4, the current source being turned off in response to the first state of the control signal.

6. A drive circuit for a liquid crystal display panel comprising:
   a current source providing a reference voltage; and
   a plurality of circuits for converting voltage levels for the liquid crystal display panel, each of the circuits further comprising:
      a signal including a first state of a first voltage level and a second state of a second voltage level;
      a first power supply providing the first voltage level;
      a first transistor including a gate electrode coupled to the first power supply, a first electrode receiving the signal, and a second electrode coupled to a node;
      a second power supply providing a third voltage level; and
      a second transistor including a gate electrode biased at the reference voltage, a first electrode coupled to the second power supply and a second electrode coupled to the node;
      wherein a voltage level at the node is pulled to approximately the third voltage level in response to the first state of the signal, and pulled to approximately the second voltage level in response to the second state of the signal.

7. The circuit of claim 6 further comprising:
   a first control signal including a first state of a first voltage level and a second state of a second voltage level; and
   a second control signal including a first state of the first voltage level and a second state of the second voltage level.

8. The circuit of claim 7, the current source being turned off in response to the first state of the first control signal.

9. The circuit of claim 7 further comprising an AND gate receiving the second control signal.

10. The circuit of claim 7 further comprising a NOR gate receiving the first control signal.

11. The circuit of claim 7, the signal becoming the first state in response to the second state of the first and second control signals.

12. The circuit of claim 7, the signal becoming the second state in response to the first state of the first control signals.

13. A circuit for converting voltage levels for a liquid crystal display panel comprising:
   a first power supply providing a first voltage level;
   a second power supply providing a second voltage level;
   a third power supply providing a third voltage level;
   a first transistor including an electrode coupled to the first power supply;
   a second transistor including an electrode coupled to the second power supply;
   a third transistor including an electrode coupled to the third power supply;
   a first input signal including a first state and a second state;
   a second input signal including a first state and a second state;
   an output signal;

a first unit turning on and turning off the first transistor respectively in response to the first and second states of the first input signal;

a second unit turning on and turning off the second transistor respectively in response to the first and second states of the second input signal;

a decoder decoding the first and second input signals and providing a decoded signal including a first state and a second state; and a third unit turning on and turning off the third transistor respectively in response to the first and second states of the decoded signal.

14. The circuit of claim 13 wherein each of the first, second, and third units further comprises:
   a first transistor including a gate electrode coupled to a fourth power supply providing a fourth voltage level; and
   a second transistor including an electrode coupled to the first power supply.

15. The circuit of claim 13 wherein a voltage level of the output signal is pulled to approximately the first voltage level in response to the first state of the first input signal and the second state of the second input signal.

16. The circuit of claim 13 wherein a voltage level of the output signal is pulled to approximately the second voltage level in response to the second state of the first input signal and the first state of the second input signal.

17. The circuit of claim 13 wherein a voltage level of the output signal is pulled to approximately the third voltage level in response to the first and second signals at a same state.

18. The circuit of claim 13, the decoder further comprising a logic NOR gate.

19. A method of converting voltage levels for a liquid crystal display panel comprising:
   providing a current source providing a reference voltage;
   providing a signal including a first state of a first voltage level and a second state of a second voltage level;
   providing a first power supply providing the first voltage level;
   providing a first transistor including a gate electrode coupled to the first power supply, a first electrode receiving the signal, and a second electrode coupled to a node;
   providing a second power supply providing a third voltage level;
   providing a second transistor including a gate electrode biased at the reference voltage, a first electrode coupled to the second power supply and a second electrode coupled to the node;
   pulling a voltage level at the node to approximately the third voltage level in response to the first state of the signal; and
   pulling a voltage level at the node to approximately the second voltage level in response to the second state of the signal.

20. The method of claim 19 further comprising:
   providing a first control signal including a first state of a first voltage level and a second state of a second voltage level; and
   providing a second control signal including a first state of the first voltage level and a second state of the second voltage level.

21. The method of claim 20 further comprising turning off the current source in response to the first state of the first control signal.

22. A method of converting voltage levels for a liquid crystal display panel comprising:
   providing a first power supply to provide a first voltage level;
   providing a second power supply to provide a second voltage level;
   providing a third power supply to provide a third voltage level;
   providing a first transistor including an electrode coupled to the first power supply;
   providing a second transistor including an electrode coupled to the second power supply;
   providing a third transistor including an electrode coupled to the third power supply;
   providing a first input signal including a first state and a second state;
   providing a second input signal including a first state and a second state;
   providing an output signal;
   providing a first unit to turn on and turn off the first transistor respectively in response to the first and second states of the first input signal;
   providing a second unit to turn on and turn off the second transistor respectively in response to the first and second states of the second input signal;
   providing a decoder to decode the first and second input signals and provide a decoded signal including a first state and a second state; and
   providing a third unit to turn on and turn off the third transistor respectively in response to the first and second states of the decoded signal.

23. The method of claim 22 further comprising providing each of the first, second, and third units with a first transistor including a gate electrode coupled to a fourth power supply providing a fourth voltage level, and a second transistor including an electrode coupled to the first power supply.

24. The method of claim 22 further comprising pulling a voltage level of the output signal to approximately the first voltage level in response to the first state of the first input signal and the second state of the second input signal.

25. The method of claim 22 further comprising pulling a voltage level of the output signal to approximately the second voltage level in response to the second state of the first input signal and the first state of the second input signal.

26. The method of claim 22 further comprising pulling a voltage level of the output signal to approximately the third voltage level in response to the first and second signals being at a same state.

* * * * *